(12) United States Patent
Langhammer et al.

(10) Patent No.: US 6,693,455 B2
(45) Date of Patent: Feb. 17, 2004

(54) PROGRAMMABLE LOGIC DEVICE INCLUDING MULTIPLIERS AND CONFIGURATIONS THEREOF TO REDUCE RESOURCE UTILIZATION

(75) Inventors: Martin Langhammer, Salisbury (GB); Chiao Kai Hwang, Fremont, CA (US); Gregory Starr, San Jose, CA (US)

(73) Assignee: Altera Corporations, San Jose, CA (US)

(*) Notice: Subject to any disclaimer, the term of this patent is extended or adjusted under 35 U.S.C. 154(b) by 0 days.

(21) Appl. No.: 10/377,962

(22) Filed: Feb. 26, 2003

(65) Prior Publication Data

US 2003/0128049 A1 Jul. 10, 2003

Related U.S. Application Data

(63) Continuation of application No. 09/955,647, filed on Sep. 18, 2001, now Pat. No. 6,556,044.

(51) Int. Cl.[7] .............. H03K 19/177; G01R 31/28; G06F 7/52
(52) U.S. Cl. ............... 326/40; 326/39; 708/523; 708/625; 714/724; 714/725; 714/726
(58) Field of Search .................... 326/37–41; 708/523, 708/625, 505, 670; 714/724–727

(56) References Cited

U.S. PATENT DOCUMENTS

| | | | |
|---|---|---|---|
| 3,473,160 A | 10/1969 | Wahlstrom | 340/172.5 |
| 4,799,004 A | 1/1989 | Mori | 324/73 R |
| 4,871,930 A | 10/1989 | Wong et al. | 307/465 |
| 4,912,345 A | 3/1990 | Steele et al. | 307/465 |
| 5,122,685 A | 6/1992 | Chan et al. | 307/465.1 |
| 5,128,559 A | 7/1992 | Steele | 307/465 |
| 5,371,422 A | 12/1994 | Patel et al. | 326/41 |
| 5,483,178 A | 1/1996 | Costello et al. | 326/41 |
| 5,636,150 A | 6/1997 | Okamoto | 364/724.01 |
| 5,689,195 A | 11/1997 | Cliff et al. | 326/41 |
| 5,754,459 A | 5/1998 | Telikepalli | 364/759 |
| 5,812,562 A | 9/1998 | Baeg | 371/22.31 |
| 5,825,202 A | 10/1998 | Tavana et al. | 326/39 |
| 5,874,834 A | 2/1999 | New | 326/39 |
| 5,880,981 A | 3/1999 | Kojima et al. | 364/736.02 |
| 5,991,898 A | 11/1999 | Rajski et al. | 714/30 |

(List continued on next page.)

FOREIGN PATENT DOCUMENTS

| | | |
|---|---|---|
| EP | 0 461 798 | 12/1991 |
| EP | 0909028 | 4/1999 |
| GB | 2 283 602 | 5/1995 |
| WO | WO01/13562 | 2/2001 |

OTHER PUBLICATIONS

Altera Corporation, "Implementing Multipliers in FLEX 10K EABs," Mar. 1996.

(List continued on next page.)

*Primary Examiner*—Vibol Tan
(74) *Attorney, Agent, or Firm*—Fish & Neave; Jeffrey H. Ingerman

(57) ABSTRACT

In a programmable logic device having dedicated multiplier circuitry, some of the scan chain registers normally used for testing the device are located adjacent input registers of the multipliers. Those scan chain registers are ANDed with the input registers, and can be loaded with templates of ones and zeroes. This allows, e.g., subset multiplication if the least significant bits are loaded with zeroes and the remaining bits are loaded with ones. The multipliers preferably are arranged in blocks with other components, such as adders, that allow them to be configured as finite impulse response (FIR) filters. In such configurations, the scan chain registers can be used to load filter coefficients, avoiding the use of scarce logic and routing resources of the device.

10 Claims, 9 Drawing Sheets

U.S. PATENT DOCUMENTS

| | | | | |
|---|---|---|---|---|
| 6,069,487 | A | 5/2000 | Lane et al. | 326/37 |
| 6,215,326 | B1 | 4/2001 | Jefferson et al. | 326/41 |
| 6,279,021 | B1 | 8/2001 | Takano et al. | 708/319 |
| 6,286,024 | B1 | 9/2001 | Yano et al. | 708/625 |
| 6,407,576 | B1 | 6/2002 | Ngai et al. | 326/41 |
| 6,407,694 | B1 | 6/2002 | Cox et al. | 342/13 |
| 6,480,980 | B2 * | 11/2002 | Koe | 714/738 |
| 6,574,762 | B1 * | 6/2003 | Karimi et al. | 714/727 |
| 6,591,283 | B1 * | 7/2003 | Conway et al. | 708/316 |
| 2002/0089348 | A1 | 7/2002 | Langhammer | 326/38 |

OTHER PUBLICATIONS

Xilinx, Inc., "Xilinx Unveils New FPGA Architecture to Enable High–Performance, 10 Million System Gate Designs," Jun. 22, 2000.

Xilinx, Inc., "Xilinx Announces DSP Algorithms, Tools and Features for Virtex–II Architecture," Nov. 21, 2000.

Xilinx, Inc., "Virtex–II 1.5V Field–Programmable Gate Arrays," module 2 of 4, Jan. 25, 2001.

Xilinx, Inc., "Virtex–II 1.5V Field–Programmable Gate Arrays," module 1 of 4, Apr. 2, 2001.

Xilinx, Inc., "Virtex–II 1.5V Field–Programmable Gate Arrays," Apr. 2, 2001, module 2 of 4.

Altera Corporation, "Implementing Logic with the Embedded Array in FLEX 10K Devices," ver. 2.1, May 2001.

QuickLogic Corporation, "The QuickDSP Design Guide," revision B, Aug. 2001.

QuickLogic Corporation, "QuickDSP™ Family Data Sheet," revision B, Aug. 7, 2001.

* cited by examiner

PROGRAMMABLE LOGIC DEVICE INCLUDING MULTIPLIERS AND CONFIGURATIONS THEREOF TO REDUCE RESOURCE UTILIZATION

CROSS REFERENCE TO RELATED APPLICATION

This is a continuation of copending, commonly assigned U.S. patent application Ser. No. 09/955,647, filed Sep. 18, 2001, now U.S. Pat. No.6,556,044.

BACKGROUND OF THE INVENTION

It has become more common to provide multiplier circuits on programmable logic devices, rather than requiring users of such devices to construct multipliers from the available programmable logic resources. However, a multiplier circuit consumes a relatively large area, and its inputs can consume significant routing resources.

For example, multipliers are provided to multiply m bits by n bits—e.g., 18×18 bits (frequently m=n). However, a user of the programmable logic device might have need of a p-bit by q-bit multiplier, where p and q are chosen by the user at the time of programming and may be different in every case, and p<m and q<n. This can be accomplished during programming by pre-loading or padding the unused bits with zeroes. However, the inputs to those unused bits have to be driven by a source, and the source has to be routed to the inputs. Therefore, padding the unused bits consumes resources which then are unavailable for other uses, even though the inputs remain constant throughout device operation.

Alternatively, additional registers could be provided and ANDed with the multiplier input registers, and each additional register could be set to either one (this would be the case for the most significant multiplier bits, which will be used) or zero (in the case of the least significant multiplier bits, which will not be used). Whether a particular register was set to zero or one could be controlled by configuration bits. While this consumes fewer resources than routing the zeroes directly to the less significant multiplier inputs, it still requires providing additional registers and configuration bits.

In another example, a multiplier might be used in a configuration in which one of its inputs is a constant coefficient, again consuming routing resources for the constant coefficient. Indeed, one such use is in a finite impulse response (FIR) filter, which requires several multipliers, compounding the use of routing resources. Moreover, in such a filter, the outputs of the various multipliers must be accumulated by a plurality of adders, consuming further routing resources to direct the various products to the adders and the sums to other adders.

It would be desirable to be able to provide programmable logic devices with multiplier circuits, where those multiplier circuits are configured to reduce resource utilization.

SUMMARY OF THE INVENTION

It is an object of the present invention to provide programmable logic devices with multiplier circuits, where those multiplier circuits are configured to reduce resource utilization.

In accordance with the present invention, there is provided a programmable logic device comprising a multiplier circuit, which may be that described in copending, commonly-assigned U.S. patent application Ser. No. 09/924, 354, filed Aug. 7, 2001, which is hereby incorporated by reference in its entirety. The programmable logic device includes a plurality of scan chain registers for testing purposes, and at least a portion of the plurality of scan chain registers are located adjacent the multiplier circuit. Input circuitry is provided for using data in the scan chain registers to modify input data to the multiplier circuit.

In accordance with one aspect of the invention, the multiplier circuit, which can multiply two numbers having m and n bits, respectively (frequently, m=n), can be configured to multiply instead p×q bits, where p<m and q<n. (frequently, p=q). This is known as subset multiplication, and the multiplier is known as a subset multiplier. To avoid wasting routing resources to pad the inputs with zeroes to account for the missing m−p bits and the missing n−q bits, the scan chains normally provided for testing of the programmable logic device are used.

Scan chains typically are provided throughout a programmable logic device for testing purposes. After the device is manufactured, a predetermined pattern of ones and zeroes is clocked through the scan chains and the progression of that pattern through the chain, which has registers throughout all parts of the device, is checked. If there is any deviation from the input pattern, that indicates a potential manufacturing flaw, which can be isolated by determining where in the chain the pattern becomes corrupted.

In accordance with this aspect of the invention, scan chain registers adjacent the multiplier inputs are ANDed with the multiplier inputs. The scan chain registers corresponding to the least significant m−p and n−q bits of the multiplier inputs are loaded, after device testing, with zeroes, while the p and q most significant bits are loaded with ones. Because no further data are input to the scan chain registers, they retain the values loaded into them throughout device operation. ANDing the scan chain registers, loaded with ones and zeroes as described above, with the multiplier inputs has the same effect as padding the least significant bits with zeroes, but without using routing resources. Thus, the routing resources connected to the least significant bits of the multiplier inputs can be used for other functions, because it does not matter for multiplication purposes what values appear in those bits, which will always be ANDed with zeroes. Because the remaining bits of the scan chain registers are loaded with ones, the values in the most significant bits of the multiplier inputs pass through the AND operation to the multiplier. Normally, the multiplier inputs are registered (synchronous input), and the scan chain registers are ANDed with the input registers. Sometimes, however, the multiplier inputs are asynchronous and not registered, in which case the scan chain registers are ANDed with the inputs themselves.

In accordance with another aspect of the present invention, there is provided a programmable logic device comprising a plurality of multiplier circuits arranged in a logic block. The logic block further comprises a plurality of adders for accumulating outputs of the plurality of multiplier circuits, as described in copending, commonly assigned U.S. patent application Ser. No. 09/955,645, filed Sep. 18, 2001, now U.S. Pat. No. 6,538,470, which is hereby incorporated by reference in its entirety. The multipliers and the adders in the logic block are configured for various uses, including formation of a finite impulse response filter.

In accordance with this aspect of the invention, the finite impulse response (FIR) filter may be a "Direct Form I" FIR filter or a "Direct Form II" FIR filter. Either type of FIR filter requires, in addition to the multipliers and adders, registers for registering either input data (samples) or intermediate data, with the number of registers preferably equaling the number of multipliers in the FIR filter. In the case of a Direct Form I FIR filter, the registers are at the outputs of the multipliers, while in a Direct Form II FIR filter, the registers are at the inputs of the multipliers.

In either type of FIR filter, one of the inputs to each multiplier sometimes is a coefficient fixed at the time of programming and specific to the use that will be made of the filter, although in other cases, such as in an adaptive FIR filter, the coefficients may vary over time. Because the coefficient may be fixed, it would be a waste of routing resources to consume those resources with the values for the coefficients. Therefore, as discussed above in connection with subset multipliers, in accordance with this aspect of the invention, the scan chain registers that are ANDed with the multiplier coefficient inputs are loaded with the filter coefficients after testing of the device is complete.

In a variant of this aspect of the invention, the scan chain registers are also used for the data (sample) inputs to the FIR filter. This is accomplished by ANDing other scan chain registers to the other inputs (or input registers) of each multiplier, and then clocking data through the scan chain during use to provide the filter sample inputs. If this variant is used, then a way must be provided to prevent the coefficient data in the scan chain registers, which are supposed to be fixed, from being clocked through the scan chain as the input sample data are clocked through. This is preferably accomplished using one or both of two methods.

The first method to prevent coefficient data from being clocked through the scan chain as the input sample data are clocked through is to provide in the scan chain one or more switches or links that can be opened after the coefficient data are loaded into the appropriate scan chain registers. Opening the link or switch would then isolate those registers from the remainder of the scan chain, so that the input sample data are not clocked through into the coefficient registers. This requires arranging the scan chain so that all of the scan chain registers to be used for coefficient data are downstream of any scan chain registers to be used for input sample data.

The second method to prevent coefficient data from being clocked through the scan chain as the input sample data are clocked through is to provide a first coefficient clock for those scan chain registers that are to be used for coefficient input, and a second separate data or sample clock for the other scan chain registers, including those to be used for sample data input. The two clocks would be connected, or run in synchrony, during "normal" scan chain testing operation and clocking in of the coefficient data. The coefficient clock would then be disconnected from the sample data clock or simply turned off, and preferably grounded, to prevent alteration of the coefficient data even though the coefficient registers remain connected to the scan chain and data is being clocked through any registers clocked by the data or sample clock. This still requires arranging the scan chain registers in the correct order with foreknowledge of which will be used for coefficients, so that all coefficient registers are downstream from all sample data registers, because even though the coefficient registers are not removed from the chain as in the previous embodiment, no data will be able to be clocked through the coefficient registers to downstream sample data registers. This also requires using the same foreknowledge to connect the correct clock to each scan chain register. This second method may be, and preferably is, used in conjunction with the first method.

For some applications, such as in adaptive FIR filters, it may be desirable or necessary to change coefficients on the fly, or at least occasionally, during operation of the device. The use of scan chains to load coefficients facilitates such on-the-fly changes. Thus, in an embodiment where the coefficients are loaded using a separate scan chain with its own clock, the clock can be restarted whenever it is desired to change the coefficients. In an embodiment where the samples and coefficients are loaded using the same scan chain, which is then broken after the coefficients are loaded, when it is desired to change the coefficients the break must be closed (as by a switch). In the latter embodiment, there will be a period, while the new coefficient data propagates through the sample portion of the chain, that the filter output is not meaningful.

Separate and apart from the use of scan chain registers as coefficient and/or sample data inputs to a FIR filter, the logic block described above including multipliers and adders that can be configured as a FIR filter includes the routing necessary to connect those elements as a FIR filter, relieving the load on the general routing of the programmable logic device. Thus, the logic block, which may be referred to as a multiplier-accumulator (MAC) block or, because it is frequently used in digital signal processing, a DSP block, includes multipliers, adders, registers in the two different locations required for the two different types of FIR filters, as discussed below, and multiplexers for selecting between the two configurations, again as discussed below.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention involves the configuring of multipliers on a programmable logic device in ways that conserve routing and other device resources while performing one or more of a number of different functions. Further resource conservation is achieved by using scan chains of the device, which otherwise remain unused during device operation, to perform certain functions as described.

The invention will now be described with reference to FIGS. 1–10.

Figure 1:
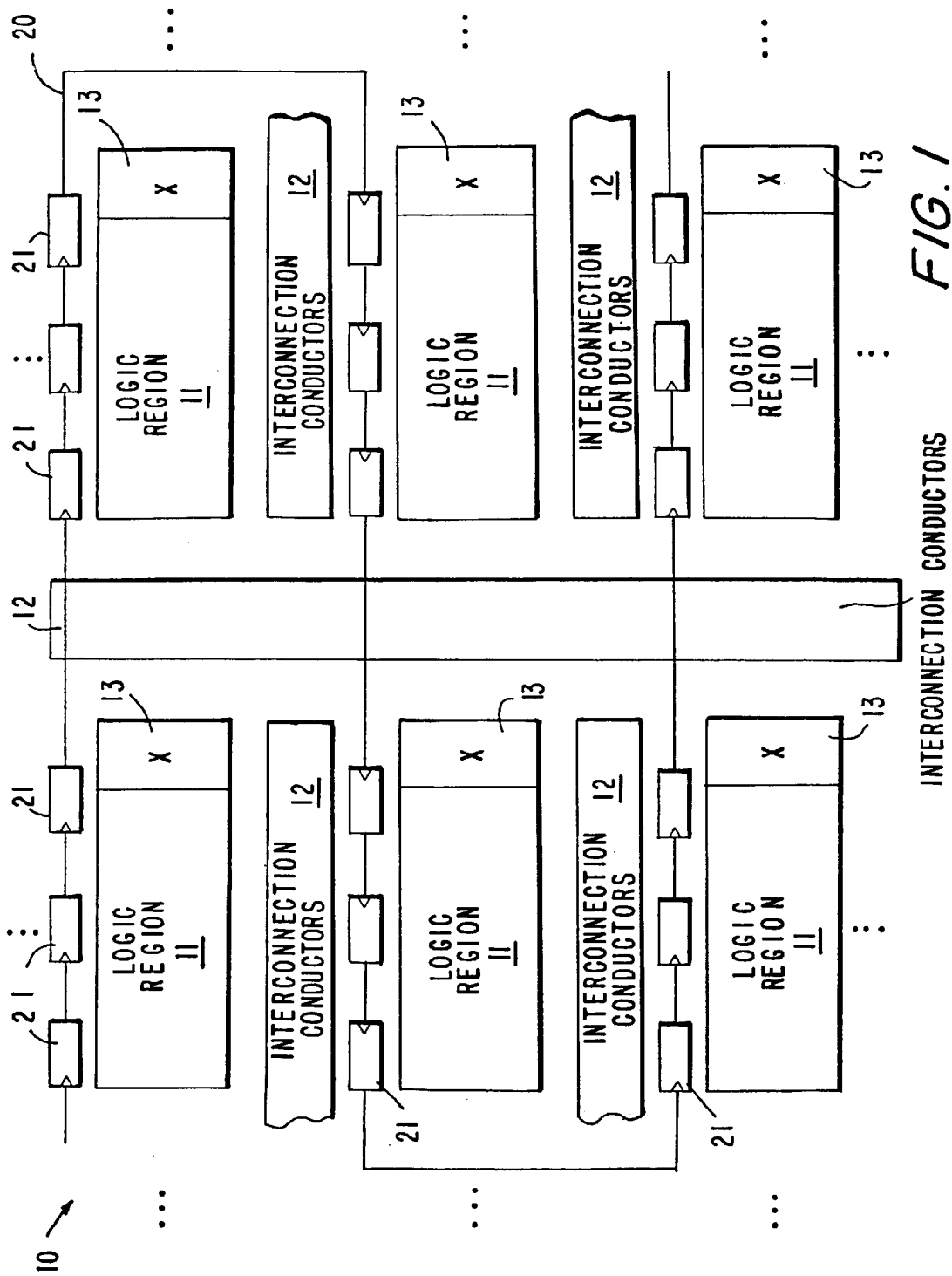
FIG. 1 is a schematic view of a portion of a programmable logic device according to the invention including a multiplier.

FIG. 1 shows in highly simplified form a portion of a programmable logic device 10. Device 10 includes regions of logic 11, which may be p-term- or sum-of-products-type logic or, more commonly, lookup table-type logic, interconnected by interconnection conductors 12 which are programmably connectable to each other and to logic regions 11.

Device 10 also preferably includes one or more multipliers 13. Each multiplier 13 may be capable of multiplying an m-bit number by an n-bit number, but a user when programming device 10 may have need for a p-bit by q-bit multiplier, where p and q are chosen by the user at the time of programming and may be different in every case, and where p<m and q<n. For example, multiplier 13 may be an 18×18 multiplier, but the user may need a 16×16 multiplier, or a 12×8 multiplier, etc. Normally, this can be achieved by padding the unused bits, which are the m−p and n−q least significant bits of the multiplicands, by permanently setting them to zero. Alternatively, the most significant bits could be padded. However, this is more complicated, because most significant bits must be sign-extended—i.e., padded with zeroes for positive numbers and ones for negative numbers. Therefore, padding the least significant bits is preferred.

Thus, for a 16×16 subset of an 18×18 multiplier, the two least significant bits of each multiplicand would be set to zero, while for a 12×8 subset of an 18×18 multiplier, the six least significant bits of one multiplicand and the ten least significant bits of the other multiplicand would be set to zero. (Actually, because the product of zero and any number is always zero, it is only necessary to set to zero the unused bits of the multiplicand having the greater number of unused bits; for the other multiplicand, it does not matter what values are in the unused bits. So in the 12×8 subset of an 18×18 multiplier, setting the ten least significant bits of the second multiplicand to zero is sufficient; the values in the six least significant bits of the first multiplicand do not matter.) This is traditionally accomplished using the normal configuration and routing resources of device 10 to set those bits equal to zero.

However, if an m×n multiplier is configured as a p×q multiplier at the time that device 10 is programmed, that configuration is fixed throughout device operation, and until device 10 is reprogrammed (if ever). Therefore, using regular routing resources to set the least significant bits of multiplier 13, when the values of those bits remain constant throughout the operation of device 10, unnecessarily removes those resources from the inventory of resources available for operation of device 10.

Figure 2:
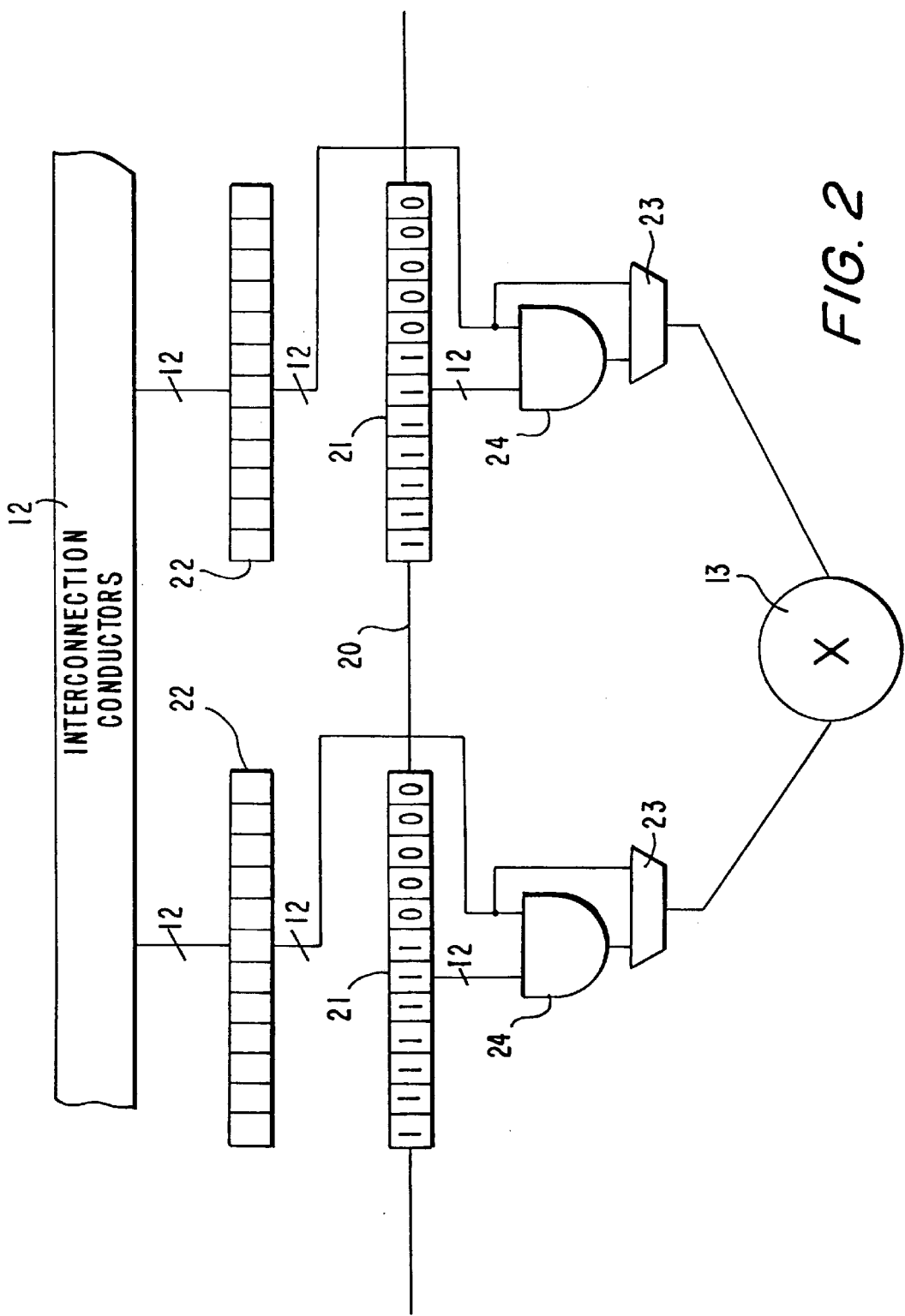
FIG. 2 is a diagrammatic view showing the use of scan chains as inputs to the multiplier of FIG. 1.

The present invention frees up those resources by using scan chains 20, shown in FIG. 2, to set the unused bits of multiplier 13. At least one scan chain 20 including scan chain registers 21 normally is provided on device 10 for testing purposes, to determine whether or not the semiconductor fabrication process that produced device 10 worked properly. One or more scan chains 20 extend through all portions of device 10. After fabrication, a known series of signals is propagated along scan chain 20, and the output at the end of scan chain 20, or along scan chain 20, is compared to the input. If the output matches the input, device 10 is considered to have been properly fabricated. If the output does not match the input, then there is assumed to have been a fabrication problem that has caused a register 21 along chain 20 to malfunction and propagate a signal incorrectly. At that point, the entire device may be scrapped, or the scanned signal may be probed at various points along scan chain 20 to determine the location and extent of the defect, in which case the device may be salvaged if the defect can be localized and the affected area taken out of use.

After a device has passed its testing, scan chain 20 and its registers. 21 generally have heretofore sat unused throughout the remaining lifetime of the device. The loss of device area to scan chains 20 has become an accepted cost.

The present invention puts scan chains 20 back to work. Specifically, because scan chains 20 reach all areas of device 10, there are scan chain registers 21 adjacent input registers 22 of multiplier 13. By providing AND gates 24, the contents. of certain scan chain registers 21 can be ANDed with the contents of certain input registers 22. By loading the scan chain registers 21 after testing is complete—e.g., at the time of programming—with ones in the scan chain registers 21 corresponding to the p and q most significant bits of input registers 22, and with zeroes in the scan chain registers 21 corresponding to the least significant bits of input registers 22, one achieves the same result, after the AND operation, as loading the least significant bits of registers 22 themselves with zeroes. A multiplexer 23 can be provided to allow selection of input register 22 itself (e.g., where the full multiplier 13 is to be used), or selection of the result of ANDing register 22 with scan chain registers 21 (e.g., for subset multiplication). Alternatively, multiplexer 23 can be omitted, and the selection of the full multiplier 13 can be made by loading scan chain registers 21 with all ones.

Figure 3:
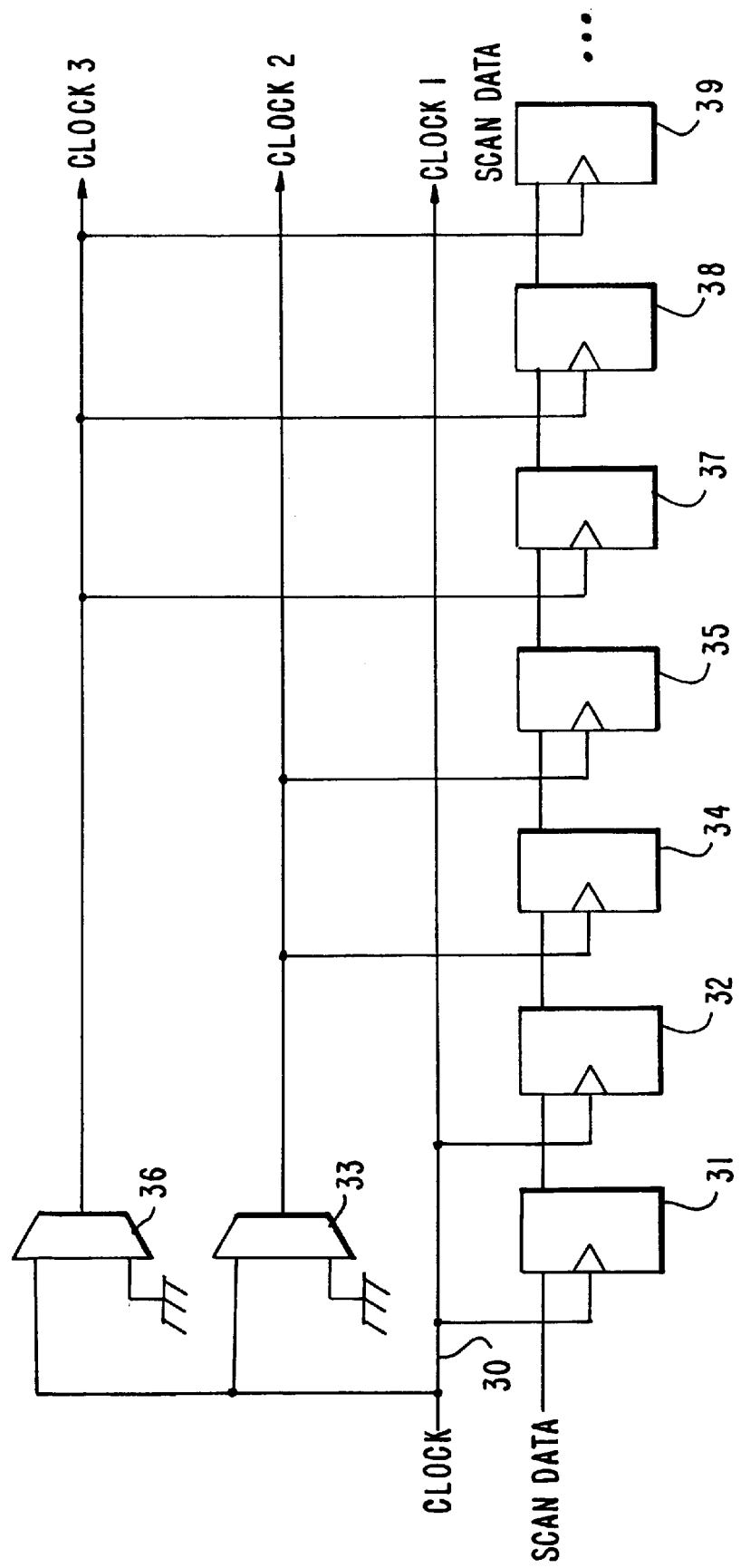
FIG. 3 is a schematic drawing of a scan chain clock control arrangement.

In order to prevent the contents of scan chain registers 21 from changing once loaded, the scan chain clock can be grounded. In some cases, certain scan chain registers 21 may be put to uses in which it is desired to be able to change their values (see below). Therefore, as shown in FIG. 3, a clock arrangement can be provided in which the clock is grounded only for certain scan chain registers 21. In one embodiment, seen in FIG. 3, scan chain clock 30 feeds directly into scan chain registers 31, 32, but passes first through multiplexer 33 be ore feeding into scan chain registers 34, 35, and through multiplexer 36 before feeding into scan chain registers 37, 38. The second input of each multiplexer 33, 36 is ground, and either multiplexer 33, 36 can be controlled to substitute ground for clock signal 30, thereby grounding the clock input for those scan chain registers 21 associated with that multiplexer, which freezes the contents of those registers.

This allows certain scan chain registers—e.g., registers 31 and 32—to he used for functions that require them to be changeable "on the fly," while others—e.g., registers 34, 35 and 37–39—can be used for functions that require them to remain fixed once set, or to be changed less frequently.

Figure 4:
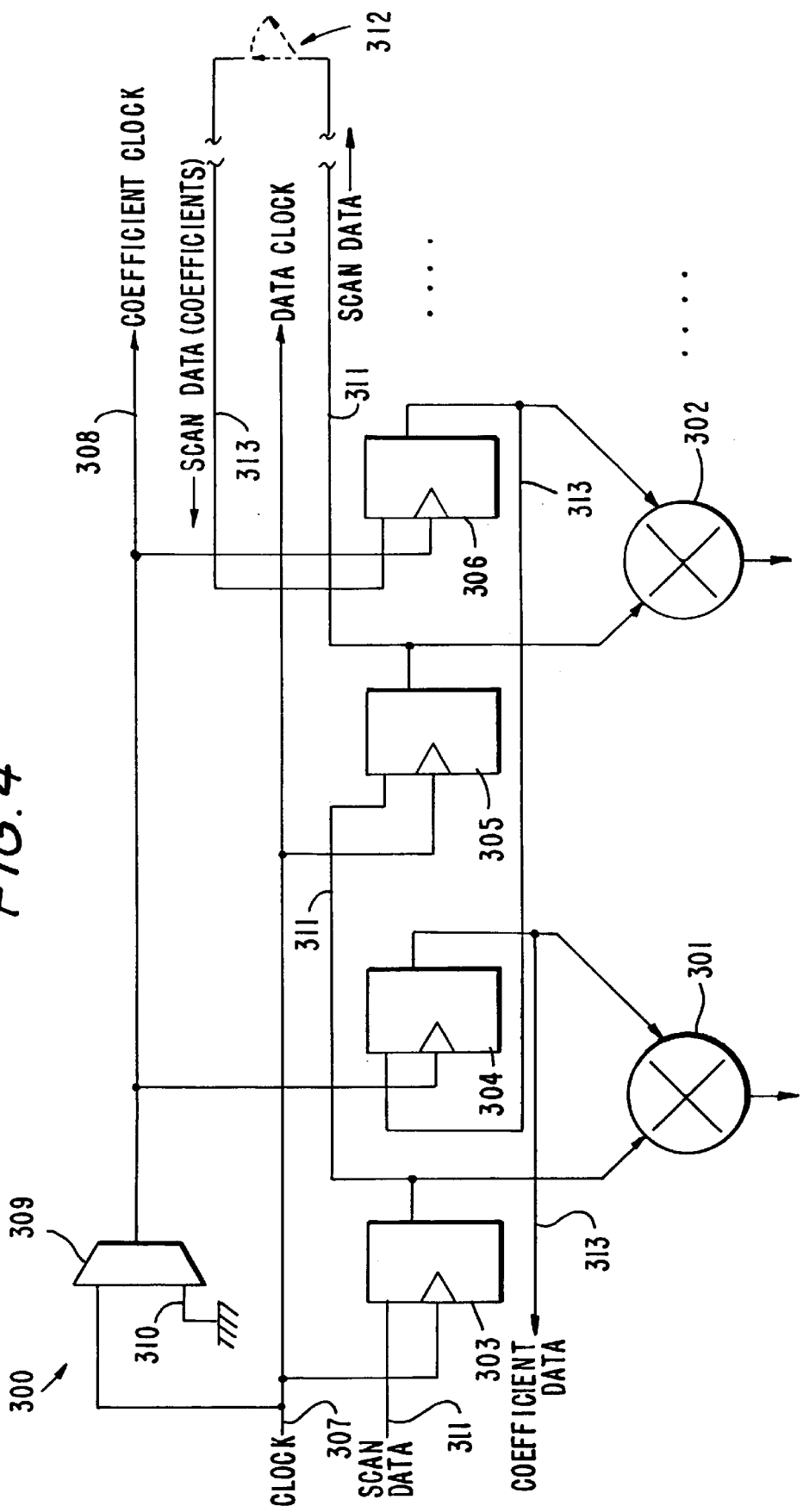
FIG. 4 is a schematic drawing of a scan chain arrangement.
Figure 5:
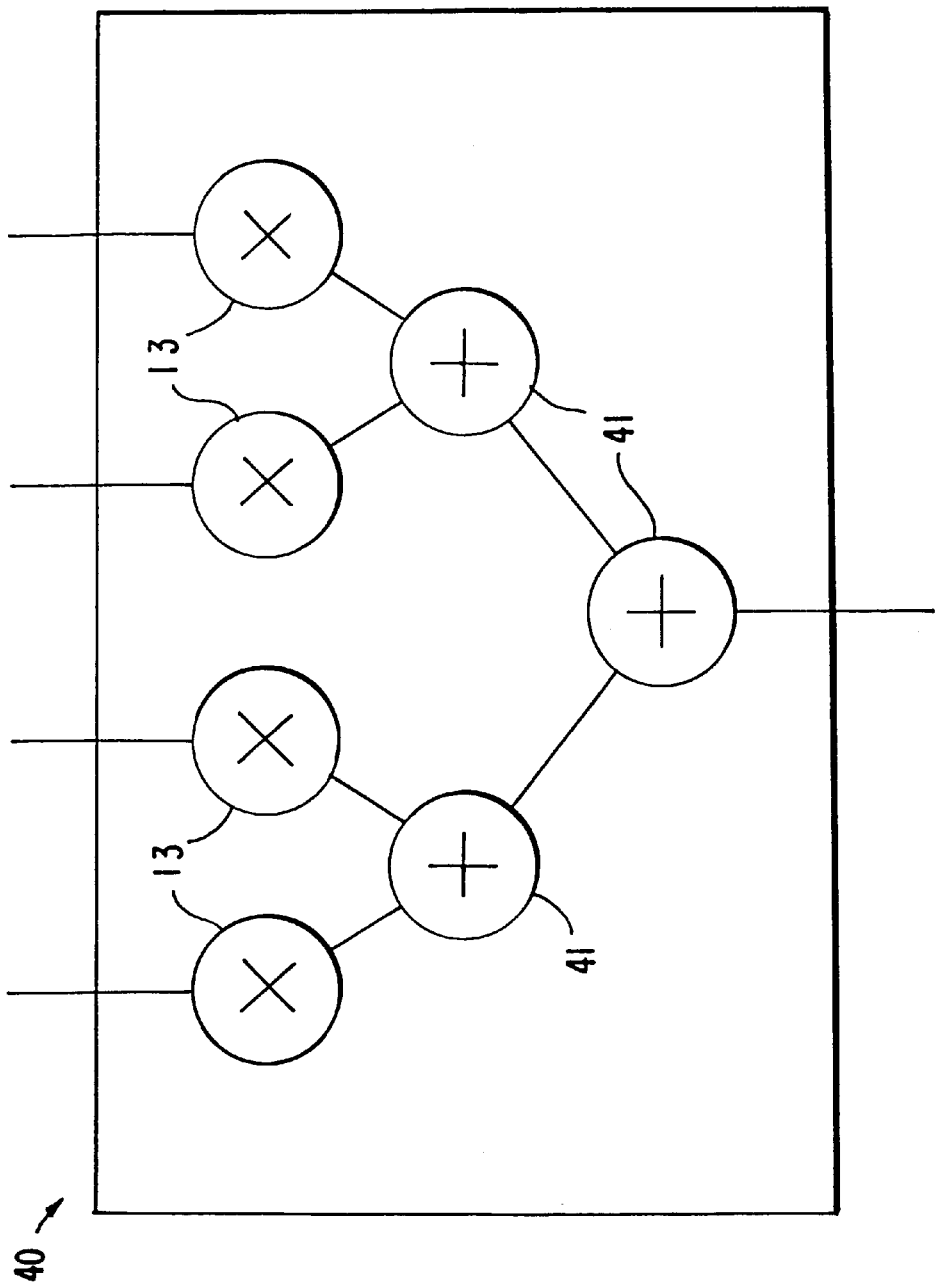
FIG. 5 is a simplified diagrammatic representation of multiplier-accumulator (MAC) block.

FIG. 4 shows a different arrangement 300 of scan chain registers used to provide both changeable data and relatively fixed coefficients to a plurality of multipliers. Although only two multipliers 301, 302 and four scan chain registers 303–306 are shown, they are preferably part of a longer chain, the remainder of which is not shown explicitly.

Spatially, scan chain registers 303–306 are arranged sequentially, but preferably they are wired so that in testing mode the scan data flow to every other register (e.g., 303, 305) in one direction, and then return in the other direction to the alternate registers (e.g., 304, 306). For testing purposes, the order in which the data reach the various registers does not matter, as long as one can determine whether or not the output pattern is identical to the input pattern. However, for testing purposes it is important that the same scan clock reaches all of the scan chain registers. Therefore, in arrangement 300 as shown in FIG. 4, the scan clock 307 preferably reaches directly to odd-numbered registers (e.g., 303, 305), and preferably reaches even-numbered registers (e.g., 304, 306) as coefficient clock 308 through multiplexer 309, which preferably, when not in testing mode, also can select ground 310 to ground coefficient clock 308, thereby freezing the coefficient values in the even-numbered registers without freezing the values in the odd-numbered registers.

Because of the alternating arrangement described above, although the even-numbered registers are interspersed spatially with the odd-numbered registers, electrically all even-numbered registers are downstream of all odd-numbered registers.

As can be seen, scan data line 311 reaches every other register (preferably the odd-numbered registers) until the data reach the spatial end of the scan chain. The data then preferably pass through switch 312 (closed during testing and coefficient loading) and return as coefficient data line 313 to the even-numbered registers. This provides an electrically continuous scan chain during testing, and during coefficient loading.

After the coefficients have been loaded in registers 304, 306 (and other even-numbered registers), switch 312 can be opened. This allows additional data to be propagated through the scan chain to provide changing data for registers 303, 305 (and other odd-numbered registers) serving as input registers to multipliers 301, 302, without changing the data in the coefficient registers 304, 306. However, in order to prevent coefficient data already in the coefficient registers from being clocked from one coefficient register to the next, until the coefficient registers are all empty (or all contain identical coefficients), coefficient clock 308 preferably is still grounded using multiplexer 309.

A plurality of multipliers similar to multiplier 13 may be provided on programmable logic device 10. If a user has an application that requires that several multipliers work together, the user can rely on the general purpose interconnect resources of device 10 to achieve the desired result. However, such needs are increasingly common, particularly in digital signal processing applications. Therefore, a particular arrangement 40, shown schematically in FIG. 5, of multipliers 13 and adders 41 may be provided on device 10 to facilitate such applications. Arrangement 40 may be referred to as a multiplier-accumulator ("MAC") block because the results of several multiplications are accumulated by adders 41, or as a "DSP" block because it is useful for digital signal processing. The provision of such blocks, which are described in more detail in above-incorporated commonly-assigned application Ser. No. 09/955,645, filed Sep. 18, 2001, now U.S. Pat. No. 6,538,470, relieves some stress on the general interconnect resources of device 10 because each block has its own internal routing resources, and also speeds up functions that otherwise would be performed by components spaced further apart on device 10.

One use in accordance with the present invention for a DSP/MAC block is to implement a finite impulse response (FIR) filter as discussed above. As also discussed above, a FIR filter can be implemented as Direct Form I FIR filter or as a Direct Form II FIR filter.

Figure 6:
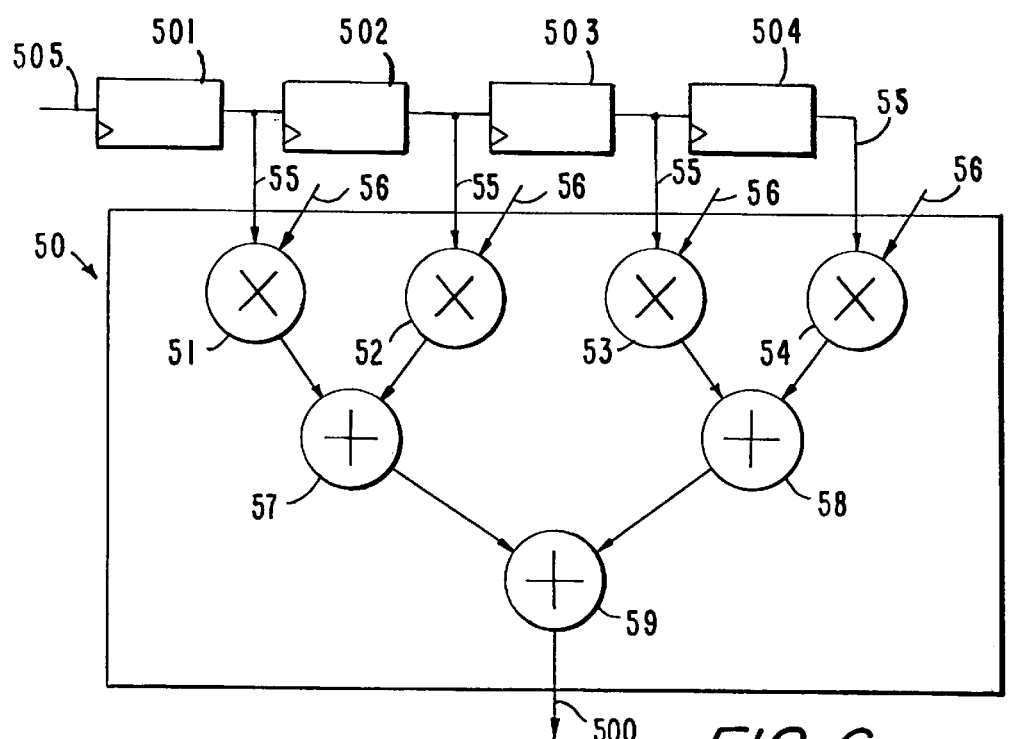
FIG. 6 is a simplified diagrammatic representation of a Direct Form II FIR filter.

One embodiment of a DSP/MAC block 50, configured as a Direct Form II FIR filter, is shown in FIG. 6. Block 50 preferably includes four multipliers 51–54, each having a data input 55 and a coefficient input 56, and three adders 57–59. The outputs of multipliers 51 and 52 preferably are added or accumulated by adder 57, while the outputs of multipliers 53 and 54 preferably are added or accumulated by adder 58. The outputs of adders 57 and 58 preferably are in turn accumulated by adder 59. DSP/MAC block 50 thus preferably has four inputs 55 and one output 500. When used as a Direct Form II FIR filter, four registers 501–504 preferably are provided upstream of inputs 55. Registers 501–504 preferably are chained on a single input 505, and each input 55 taps the output of a respective register 501–504. Additional inputs or routing resources (not shown) are required to load coefficients into coefficient registers (not shown) connected to coefficient inputs 56.

Figure 7:
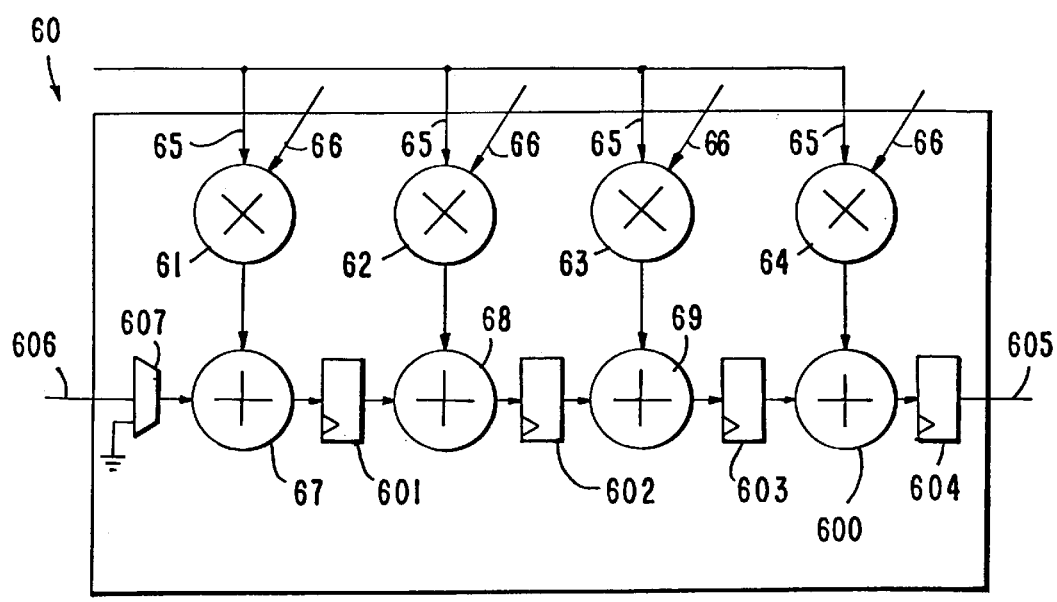
FIG. 7 is a simplified diagrammatic representation of a Direct Form I FIR filter.
Figure 8:
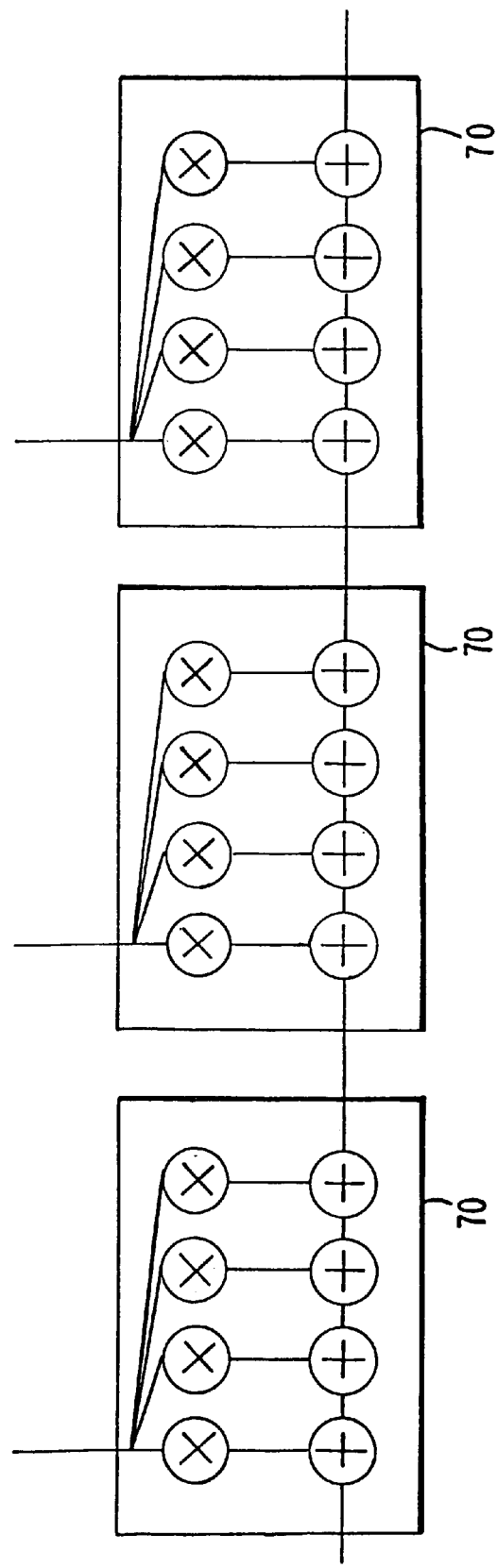
FIG. 8 is a simplified diagrammatic representation of several chained Direct Form I FIR filters, each a simplified version of that shown in FIG. 7.

Another embodiment of a DSP/MAC block 60, configured as a Direct Form I FIR filter, is shown in FIG. 7. Block 60 preferably includes four multipliers 61–64, each preferably having a data input 65 and a coefficient input 66, four adders 67, 68, 69, 600, and four registers 601–604. Each adder 67, 68, 69, 600 preferably adds the output of one of multipliers 61–64 to the output of a previous adder and registers it in corresponding register 601–604. Specifically, each subsequent adder preferably adds the registered output of the previous adder, rather than the direct output, to the corresponding multiplier output. The last sum preferably is provided as output 605. In the case of the first adder 67, the output of multiplier 61 is added to an input 606 from elsewhere on device 10, which might be the sum output of another DSP/MAC block. In the case of the first DPS/MAC block in the chain, input 606 is preferably zeroed. This can be accomplished through the device routing, or multiplexer 607 can be provided to select between ground (zero) and input 606. Using multiplexer 607 conserves routing resources, at the expense of requiring an additional configuration bit. Note that multiplexer 607 preferably is provided in every DSP/MAC block 60 on device 10, because any such block can be configured as the "first" block. As in the case of block 50, additional inputs or routing resources (not shown) are required to load coefficients into coefficient registers (not shown) connected to coefficient inputs 66.

Each input 65 of the Direct Form I FIR filter shown in FIG. 7 taps the same data source. Therefore, block 60 could be configured so that it has only one input, instead of four inputs, with that one input routed internally of block 60 to the various multipliers 61–64. With another input 71 for the previous sum, and output 605, such a reconfigured block 70 (several chained in FIG. 8) requires only three input/output connections. This is many fewer connections than otherwise would be required, and conserves routing resources, although it may still be necessary to route in the coefficients if they are not fixed and need to be changed more frequently than the scan chain arrangement can support.

Figure 9:
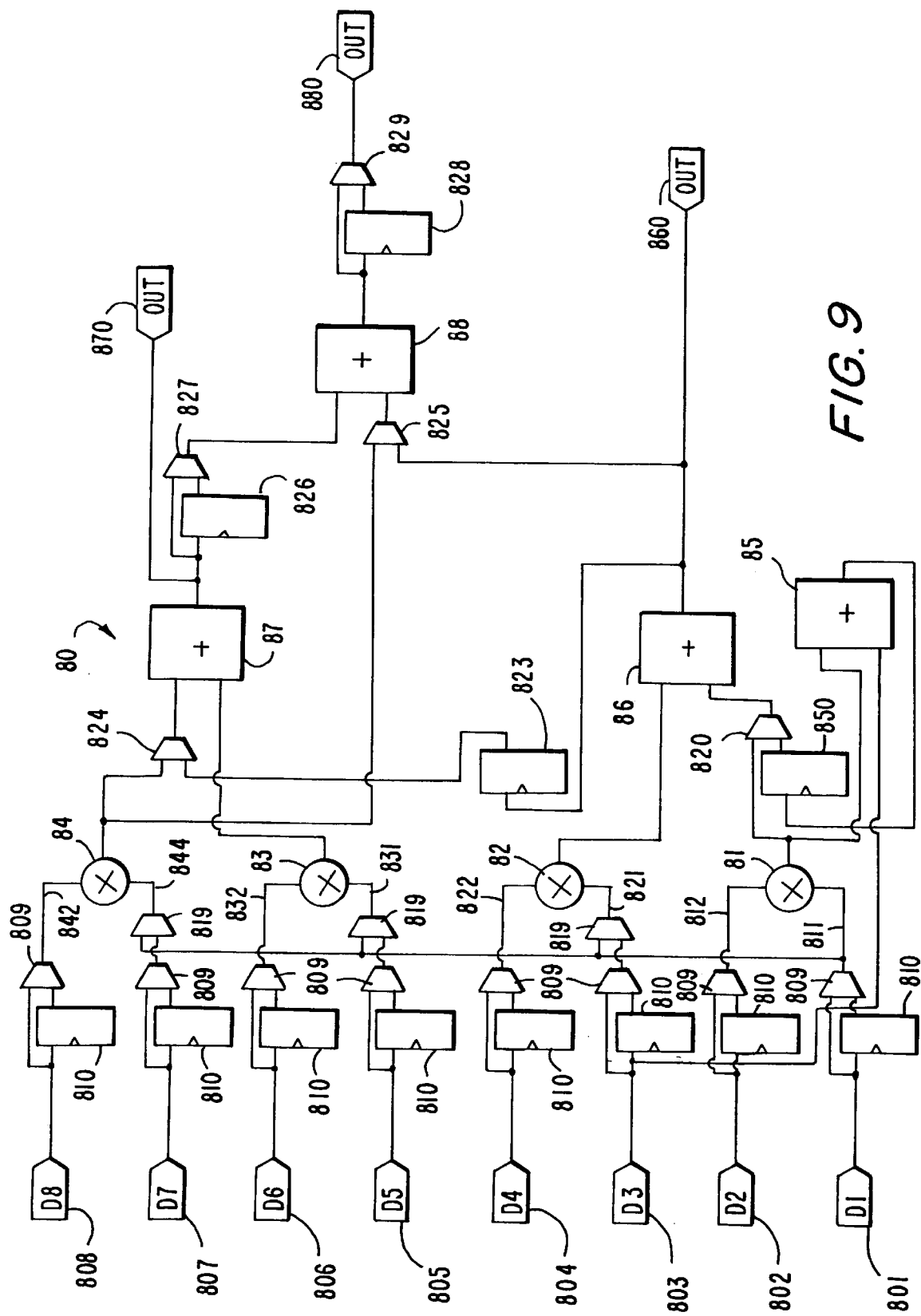
FIG. 9 is a schematic diagram of a MAC block according to the present invention that can be configured as either a Direct Form I FIR filter or a Direct Form II FIR filter.

FIG. 9 is a schematic circuit diagram of a preferred embodiment of a DSP/MAC block 80 which can be configured, among other things, as either a Direct Form I FIR filter or a Direct Form II FIR filter. Block 80 preferably includes four multipliers 81–84. Multiplier 81 has a first input 811 and a second input 812. Similarly, each of multipliers 82–84 has a respective first input 821, 831, 841 and a respective second input 822, 832, 842. Each multiplier input 811, 812, 821, 822, 831, 832, 841 and 842 can be selectively connected, using a respective one of multiplexers 809, either directly to one of data inputs 801–808 (designated D1–D8) or to one of registers 810, each of which registers a respective one of inputs 801–808. In addition, each of inputs 821, 831, 841 can be connected, using a respective one of additional multiplexers 819, so that it shares D1 data input 801 with multiplier 81, to implement the type of single-data-input Direct Form I FIR filter shown in FIG. 7.

DSP/MAC block 80 also includes four adders 85–88. In order for DSP/MAC block 80 to function as a Direct Form II FIR filter, the outputs of multipliers 81 and 82 can be added by adder 86 and the outputs of multipliers 83 and 84 can be added by adder 87. The output of adders 86 and 87 can in turn be added together by adder 88.

It should be noted that the output of multiplier 81 is also available as an input to adder 85, to which D3 data input 803 is also an input, with the output of adder 85 registered in register 850 and available as an input to adder 86 under the control of multiplexer 820, for reasons described below similarly, while the output of multiplier 84 is available as an input to adder 87, that input to adder 87 may also be the output of adder 86, as registered in register 823, with the selection made by multiplexer 824, for reasons discussed below.

The outputs of adders 86, 87 may be input to adder 88 to be added together as discussed above. The output of adder 86 may be selected as an input to adder 88 by multiplexer 825, which also may select the output of multiplier 84. The output of adder 87 may be input to adder 88 directly or after registration in register 826, with the selection made by multiplexer 827. The output of adder 88 is output at 880 directly or after registration in register 828, with the selection made by multiplexer 829. The outputs of adders 86, 87 also are available as outputs at 860, 870 but not when DSP/MAC block 60 is used as a FIR filter. Other uses for DSP/MAC block 60 are described in above-incorporated application Ser. No. 09/955,645, filed Sep. 18, 2001, now U.S. Pat. No. 6,538,470.

As discussed above, each of D1–D8 data inputs 801–808 can be fed directly to one of multipliers 81–84 (through respective multiplexer 809) or to a respective one of registers 810 and thence to multiplier 81–84 (through respective multiplexer 809). This generic structure is provided because DSP/MAC block 80 may have many uses. However, for the use described above in a FIR filter, it would be expected that a respective one of registers 810 would be used to store the filter coefficients on one input of each multiplier 81–84— e.g., inputs 812, 822, 832 and 842. The coefficients could be entered from appropriate ones of D1–D8 inputs 801–808, but also could be entered, as discussed above, using scan chain registers adjacent to appropriate ones of registers 810.

When DSP/MAC block 80 is configured as a Direct Form I FIR filter, single D1 data input 801 is input to multiplier 81 on input 811, and is also made available to inputs 821, 831, 841 by multiplexers 819, as discussed above. Multiplier 81 multiplies the D1 data on input 811 by the coefficient on input 812, and that product is added by adder 85 to a previous sum from another DSP/MAC block or to zero, as described above in connection with FIG. 7. The previous sum is entered on D3 data input 803, which is not needed for data input 821 to multiplier 82, because the four multipliers 81–84 are sharing D1 data input 801. The output of adder 85 is registered in register 850.

Adder 86 adds the output of multiplier 82 (the product of the D1 data and the coefficient on input 822) to the registered sum in register 850, selected by multiplexer 820. That sum output of adder 86 is registered in register 823. Adder 87 adds the output of multiplier 83 (the product of the D1 data and the coefficient on input 832) to the registered sum in register 823, selected by multiplexer 824. That sum output of adder 87 is registered in register 826. Adder 88 adds the output of multiplier 84 (the product of the D1 data and the coefficient on input 842), selected by multiplexer 825, to the registered sum in register 826, selected by multiplexer 827. That sum output of adder 88 is registered in register 828, which is selected by multiplexer 829 as the output 880 of the Direct Form I FIR filter.

When DSP/KAC block 80 is configured as a Direct Form II FIR filter, the coefficients will have been registered in appropriate registers 810 associated with multiplier inputs 812, 822, 832, 842 as above. D1 data input 801 will be selected by associated multiplexer 809 for connection to multiplier 81 input 811. D3 data input 803 will be selected by associated multiplexer 809 for connection to multiplier 82 input 821. D5 data input 805 will be selected by associated multiplexer 809 for connection to multiplier 83 input 831. D7 data input 807 will be selected by associated multiplexer 809 for connection to multiplier 84 input 841.

Multiplier 81 multiplies the data on D1 input 801, selected by associated multiplexer 809 for input 811, by the coefficient on input 812. Multiplier 82 multiplies the data on D3 input 803, selected by associated multiplexer 809 for input 821, by the coefficient on input 822. Multiplier 83 multiplies the data on D5 input 805, selected by associated multiplexer 809 for input 831, by the coefficient on input 832. Multiplier 84 multiplies the data on D7 input 807, selected by associated multiplexer 809 for input 841, by the coefficient on input 842.

Adder 86 adds the out of multiplier 81, selected by multiplexer 820, to the output of multiplier 82. Adder 87 adds the output of multiplier 84, selected by multiplexer 824, to the output of multiplier 83. Adder 88 adds the output of adder 86, selected by multiplexer 825, to the output of adder 87, selected by multiplexer 827. The output of adder 88 is selected by multiplexer 829 for output directly to output 880 as the output of the Direct Form II FIR filter.

According to an optional modification (not shown) of block 80, each input register 810 can be configured to feed the next input register 810, rather than just its respective multiplier. In this way, registers 810 can function as the delay chain (cf. 501–504 in FIG. 6) of the Direct Form II FIR filter, allowing the delay chain to be moved inside the block, conserving external logic and routing resources. This will require an additional multiplexer (not shown) at the input of each register 810, to select between (a) the respective D1–D8 input 801–808 and (b) the previous register 810.

It should be noted that FIG. 9 does not show the scan chains discussed above. However, block 80 preferably does include those scan chains, which preferably are used as discussed above in the operation of block 80.

Figure 10:
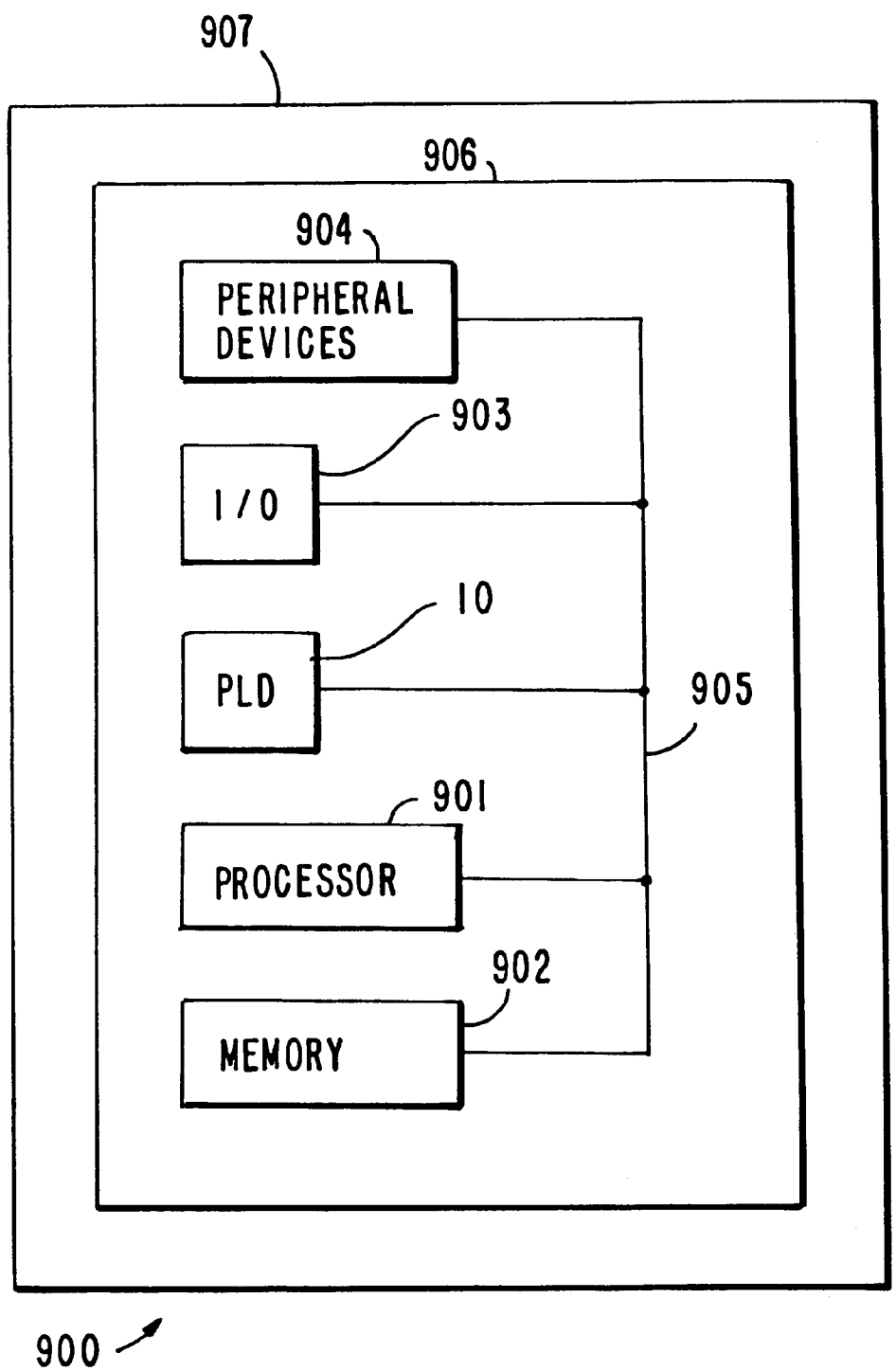
FIG. 10 is a simplified block diagram of an illustrative system employing a programmable logic device in accordance with the invention.

FIG. 10 illustrates a programmable logic device 10 of this invention in a data processing system 900. Data processing system 900 may include one or more of the following components: a processor 901; memory 902; I/O circuitry 903; and peripheral devices 904. These components are coupled together by a system bus 905 and are populated on a circuit board 966 which is contained in an end-user system 907.

System 900 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 901. Programmable logic device 10 may also be used as an arbiter for arbitrating access to a shared resource in system 900. In yet another example, programmable logic device 10 can be configured as an interface between processor 901 and one of the other components in system 900. It should be noted that system 900 is only exemplary, and that the true scope and spirit of the invention should be indicated by the following claims.

Various technologies can be used to implement programmable logic devices 10 employing scan chains and/or DSP/MAC blocks according to this invention. Moreover, this invention is applicable to both one-time-only programmable and reprogrammable devices.

Thus it is seen that programmable logic devices with multiplier circuits, where those multiplier circuits are configured to reduce resource utilization, have been provided. One skilled in the art will appreciate that the present invention can be practice by other than the described embodiments, which are presented for purposes of illustration and not of limitation, and the present invention is limited only by the claims that follow.

What is claimed is:

1. A programmable logic device comprising:

a plurality of scan chain registers; and a function block configurable as a finite impulse response filter; said function block comprising:
a plurality of multipliers, each of said multipliers having a respective first input for data to be filtered by said finite impulse response filter, and a respective second input for a respective coefficient of said finite impulse response filter;
a plurality of adders for accumulating outputs of said multipliers; and
a plurality of filter registers, each of said registers being operatively connected to at least one of (a) one of said multipliers, and (b) one of said adders; wherein:
each of said respective second inputs is connected to a respective one of said scan chain registers that is adjacent said function block; whereby:
coefficients for said finite impulse response filter are loaded via said scan chain registers.

2. The programmable logic device of claim 1 wherein:

respective ones of said scan chain registers are connected to respective ones of said second inputs; and said coefficients are stored in said respective ones of said scan chain registers.

3. The programmable logic device of claim 1 further comprising coefficient storage registers connected to respective ones of said second inputs; wherein:

respective ones of said scan chain registers are located adjacent said coefficient storage registers; and said coefficients are loaded into said coefficient storage registers from said respective ones of said scan chain registers.

4. The programmable logic device of claim 1 wherein:

said filter registers are connected to said respective first inputs; and said adders add together outputs of all of said multipliers; whereby:
said function block is configured as a Direct Form II finite impulse response filter.

5. The programmable logic device of claim 4 wherein:

said filter registers form a serial chain of filter registers connected to a single data source, each of said filter registers having an output; and said output of each said filter register is connected to said first input of a respective one of said multipliers.

6. The programmable logic device of claim 5 comprising:

first, second, third and fourth ones of said filter registers;

first, second, third and fourth ones of said multipliers; and first, second and third ones of said adders; wherein:
each of said multipliers and said adders has a first input, a second input and an output;
said output of said first filter register is connected to said first input of said first multiplier;
said output of said second filter register is connected to said first input of said second multiplier;
said output of said third filter register is connected to said first input of said third multiplier;
said output of said fourth filter register is connected to said first input of said fourth multiplier;
said outputs of said first and second multipliers are connected to said first and second inputs of said first adder;
said outputs of said third and fourth multipliers are connected to said first and second inputs of said second adder;

said outputs of said first and second adders are connected to said first and second inputs of said third adder; and said output of said third adder is output of said Direct Form II finite impulse response filter.

7. The programmable logic device of claim 1 wherein:

each of said multipliers and said adders has an output;

each of said adders adds an output of one said multipliers to another datum; and a respective one of said filter registers is connected to said output of each respective one of said adders; whereby:
said function block is configured as a Direct Form I finite impulse response filter.

8. The programmable logic device of claim 7 wherein all of said first inputs of said respective multipliers are connected to a single data source.

9. The programmable logic device of claim 8 further comprising:

first, second, third and fourth ones of said filter registers;

first, second, third and fourth ones of said multipliers; and first, second, third and fourth ones of said adders; wherein:
for said first one of said adders, said another datum comprises one of (a) an external input, and (b) ground;
for each of said second, third and fourth ones of said adders, said another datum comprises contents of a respective one of said first, second and third filter registers; and
output of said Direct Form I finite impulse response filter comprises contents of said fourth one of said filter registers.

10. A method of programming a programmable logic device, said programmable logic device having scan chain registers and having a function block configurable as a finite impulse response filter, at least some of said scan chain registers being adjacent said function block, said method comprising:

testing said programmable logic device by clocking test data through said scan chain registers; and after completion of said testing, clocking finite impulse response filter coefficients into said at least some of said scan chain registers.

* * * * *